(12) United States Patent
Tseng et al.

(10) Patent No.: US 12,740,078 B2
(45) Date of Patent: Sep. 15, 2026

(54) POWER DIODE DEVICE AND METHOD OF MANUFACTURING THE SAME

(71) Applicant: Diodes Incorporated, Plano, TX (US)

(72) Inventors: Ching Chiu Tseng, Keelung City (TW); Tzu Yuan Lo, Keelung City (TW); Chao Yi Chang, Keelung City (TW)

(73) Assignee: Diodes Incorporated, Plano, TX (US)

( * ) Notice: Subject to any disclaimer, the term of this patent is extended or adjusted under 35 U.S.C. 154(b) by 409 days.

(21) Appl. No.: 18/205,288

(22) Filed: Jun. 2, 2023

(65) Prior Publication Data

US 2024/0128381 A1 Apr. 18, 2024

(30) Foreign Application Priority Data

Oct. 12, 2022 (TW) ................................. 111138688

(51) Int. Cl.
*H10D 8/00* (2025.01)
*H10D 8/01* (2025.01)
(Continued)

(52) U.S. Cl.
CPC ............ *H10D 8/422* (2025.01); *H10D 8/045* (2025.01); *H10D 62/103* (2025.01);
(Continued)

(58) Field of Classification Search
CPC ...... H10D 8/422; H10D 8/045; H10D 62/111; H10D 62/105; H10D 12/441;
(Continued)

(56) References Cited

U.S. PATENT DOCUMENTS 6,054,748 A * 4/2000 Tsukuda ............... H10D 12/032
257/E29.066
9,431,479 B2 * 8/2016 Honda ................ H10D 62/104
(Continued)

FOREIGN PATENT DOCUMENTS

CN 112289867 A 1/2021
CN 113659014 A 11/2021
(Continued)

OTHER PUBLICATIONS

Office Action for Japanese Patent Application No. 2023-175694, mailed on Oct. 18, 2024, 21 pages.
(Continued)

*Primary Examiner* — William B Partridge
*Assistant Examiner* — Alexandre X Ramirez
(74) *Attorney, Agent, or Firm* — AP3 Law Firm PLLC

(57) ABSTRACT

A power diode device includes a substrate. The substrate includes a core layer of a first conductive type, a first diffusion layer of the first conductive type, a second diffusion layer of a second conductive type, and a heavily doped region of the second conductive type. The core layer is located between the first diffusion layer and the second diffusion layer. A thickness of the core layer is greater than that of the second diffusion layer. The heavily doped region is located in the second diffusion layer and extends toward the core layer to form a PN junction between the heavily doped region and the core layer. A method for manufacturing the power diode device is also provided.

20 Claims, 10 Drawing Sheets

(51) Int. Cl.
*H10D 62/10* (2025.01)
*H10W 74/10* (2026.01)

(52) U.S. Cl.
CPC ......... *H10D 62/109* (2025.01); *H10D 62/111* (2025.01); *H10D 62/114* (2025.01); *H10W 74/137* (2026.01)

(58) Field of Classification Search
CPC . H10D 62/109–111; H10D 64/20–529; H10D 62/112
See application file for complete search history.

(56) References Cited

U.S. PATENT DOCUMENTS

| | | | | |
|---|---|---|---|---|
| 2005/0280004 | A1* | 12/2005 | Das | H10D 12/031 257/E29.066 |
| 2014/0367737 | A1 | 12/2014 | Takahashi et al. | |
| 2016/0308029 | A1 | 10/2016 | Zhong et al. | |

FOREIGN PATENT DOCUMENTS

| | | | | | |
|---|---|---|---|---|---|
| JP | S54101278 | A | | 8/1979 | |
| JP | S63194361 | A | | 8/1988 | |
| JP | 2001007347 | A | * | 1/2001 | H01L 29/0615 |
| JP | 2006073710 | A | * | 3/2006 | H10D 62/128 |
| JP | 2014241367 | A | | 12/2014 | |
| JP | 2015050421 | A | | 3/2015 | |

OTHER PUBLICATIONS

Office Action for Korean Patent Application No. 10-2023-0134321, mailed Aug. 27, 2024, 9 pages.
Extended European Search Report for European Application No. 23201964.6, mailed Mar. 12, 2024, 9 pages.
Office action and Search Report for Taiwan Patent Application No. 111138688, mailed Jun. 28, 2023, 6 pages.
Office Action for European Patent Application No. 23201964.6, mailed Sep. 12, 2025, 9 pages.

* cited by examiner

POWER DIODE DEVICE AND METHOD OF MANUFACTURING THE SAME

CROSS-REFERENCE TO RELATED APPLICATIONS

This patent application claims priority to Taiwan Application No. 111138688, filed on Oct. 12, 2022 and entitled "POWER DIODE DEVICE AND METHOD OF MANUFACTURING THE SAME," which is hereby incorporated by reference herein as if reproduced in its entirety.

TECHNICAL FIELD

The present disclosure relates to the field of power diodes, and in particular embodiments, to a power diode device and method of manufacturing the same.

BACKGROUND

A conventional power diode may have a mesa structure to define an active region and a junction termination. The mesa structure can be formed by etching the sides of the substrate through an etching process. Since the upper half of the substrate is used to form a mesa, the thickness is small and the structural strength is reduced. In addition, if the gradient of the side surface of the mesa cannot be precisely controlled during the etching process, the electrical performance of the power diode may be affected, for example, the breakdown voltage is not high enough.

It is also possible to use a power diode with a planar structure, and form a guard ring to relax the electric field distribution, to increase the breakdown voltage of the power diode. However, for power diodes with high voltage (for example, voltage greater than 600 V), in order to further increase the breakdown voltage, the number of guard rings needs to be increased, but the number of guard rings is limited by the line width capability of the process. In addition, the larger the number of the guard rings, the more the proportion of the area occupied by the guard rings, which is not conducive to the reduction of the device size, and increases the manufacturing cost.

SUMMARY

Technical advantages are generally achieved, by embodiments of this disclosure which describe a power diode device and method of manufacturing the same.

Embodiments of the present disclosure relate to a power diode device. The power diode device includes a substrate, which includes: a core layer of a first conductivity type, a first diffusion layer of the first conductivity type, a second diffusion layer of a second conductivity type, and a heavily doped region of the second conductivity type. The core layer has a first surface and a second surface opposite to the first surface of the core layer. The first diffusion layer has a first surface and a second surface opposite to the first surface of the first diffusion layer. The second diffusion layer has a first surface and a second surface opposite to the first surface of the second diffusion layer. The thickness of the core layer is greater than the thickness of the second diffusion layer. The core layer is located between the first diffusion layer and the second diffusion layer, such that the first surface of the core layer faces the second surface of the first diffusion layer, the second surface of the core layer faces the first surface of the second diffusion layer, the second surface of the second diffusion layer forms the top surface of the substrate, and the first surface of the first diffusion layer forms the bottom surface of the substrate. The heavily doped region has a first surface and a second surface opposite to the first surface of the heavily doped region. The second surface of the heavily doped region is coplanar with the second surface of the second diffusion layer, and the heavily doped region extends toward the core layer such that the first surface of the heavily doped region reaches the second surface of the core layer, or reaches in-between the first surface of the core layer and the second surface of the core layer but without reaching the first surface of the core layer, such that the heavily doped region and the core layer form a first PN junction.

Embodiments of the present disclosure relate to a manufacturing method of a power diode device. The manufacturing method includes forming a first diffusion layer of a first conductivity type in a substrate of the first conductivity type. The first diffusion layer has a first surface and a second surface opposite to the first surface of the first diffusion layer. The first surface of the first diffusion layer forms the bottom surface of the substrate. The manufacturing method further includes forming a second diffusion layer of a second conductivity type in the substrate, where the second diffusion layer has a first surface and a second surface opposite to the first surface of the second diffusion layer, and the second surface of the second diffusion layer forms the top surface of the substrate. The first diffusion layer is not in contact with the second diffusion layer, and the portion between the first diffusion layer and the second diffusion layer is a core layer. The manufacturing method further includes forming a heavily doped region of the second conductivity type in the second diffusion layer. The heavily doped region has a first surface and a second surface opposite to the first surface of the heavily doped region, and the second surface of the heavily doped region is coplanar with the top surface of the substrate. The manufacturing method also includes diffusing the heavily doped region towards the core layer to form a first PN junction between the heavily doped region and the core layer.

According to one aspect of the present application, a power diode device is provided that includes a substrate. The substrate includes: a first diffusion layer of a first conductivity type, the first diffusion layer comprising a first surface and a second surface opposite to each other, and the first surface of the first diffusion layer forming a bottom surface of the substrate; a second diffusion layer of a second conductivity type, the second diffusion layer comprising a first surface and a second surface opposite to each other, and the second surface of the second diffusion layer forming a top surface of the substrate; a core layer of the first conductivity type between the first diffusion layer and the second diffusion layer, the core layer comprising a first surface and a second surface opposite to each other, the first surface of the core layer facing the first diffusion layer, the second surface of the core layer facing the second diffusion layer, and a thickness of the core layer being greater than a thickness of the second diffusion layer; and a heavily doped region of the second conductivity type in the second diffusion layer and extending toward the core layer, the heavily doped region comprising a first surface and a second surface opposite to each other, the second surface of the heavily doped region being coplanar with the second surface of the second diffusion surface, the first surface of the heavily doped region reaching the second surface of the core layer or reaching in-between the first surface of the core layer and the second surface of the core layer without reaching the first surface of the core layer, wherein a first PN junction is formed between the heavily doped region and the core layer.

According to another aspect of the present application, a method for making a power diode is provided. The method includes: forming a first diffusion layer of a first conductivity type in a substrate of the first conductivity type, the first diffusion layer comprising a first surface and a second surface opposite to each other, and the first surface of the first diffusion layer forming a bottom surface of the substrate; forming a second diffusion layer of a second conductivity type in the substrate, with a core layer located between the second diffusion layer and the first diffusion layer, the second diffusion layer comprising a first surface and a second surface opposite to each other, and the second surface of the second diffusion layer forming a top surface of the substrate; forming a heavily doped region of the second conductivity type in the second diffusion layer, the heavily doped region comprising a first surface and a second surface opposite to each other, and the second surface of the heavily doped region being coplanar with the top surface of the substrate; and diffusing the heavily doped region into the core layer to form a first PN junction between the heavily doped region and the core layer.

According to another aspect of the present application, a power diode is provided that includes: a first diffusion layer of a first conductivity type in a substrate, the first diffusion layer comprising a first surface and a second surface opposite to each other, and the first surface of the first diffusion layer being a bottom surface of the substrate; a second diffusion layer of a second conductivity type in the substrate, the second diffusion layer comprising a first surface and a second surface opposite to each other, and the second surface of the second diffusion layer being a top surface of the substrate; a core layer of the first conductivity type between the first diffusion layer and the second diffusion layer, the core layer comprising a first surface and a second surface opposite to each other, the first surface of the core layer facing the first diffusion layer, and the second surface of the core layer facing the second diffusion layer; a heavily doped region of the second conductivity type in the second diffusion layer, the heavily doped region extending into the core layer without reaching the first surface of the core layer, with a first PN junction formed between the heavily doped region and the core layer; and an isolation structure separated from the heavily doped region by the second diffusion layer.

Advantages of the aspects of the present application include improved wafer strength, electric field distribution, breakdown voltage and terminal length, reduced die size and masks, simplified process and decreased cost. The aspects of the present application may be applied for high voltage power diode devices.

BRIEF DESCRIPTION OF THE DRAWINGS

Embodiments of the present disclosure may be better understood from the following detailed description when read with accompanying drawings. It should be noted that the various structures may not be drawn to scale. In fact, the dimensions of the various structures may be arbitrarily enlarged or reduced for clarity of discussion.

The technical solutions and beneficial effects of the present application will be made apparent through the detailed description of embodiments of the present application in conjunction with the accompanying drawings, in which.

Figure 1:
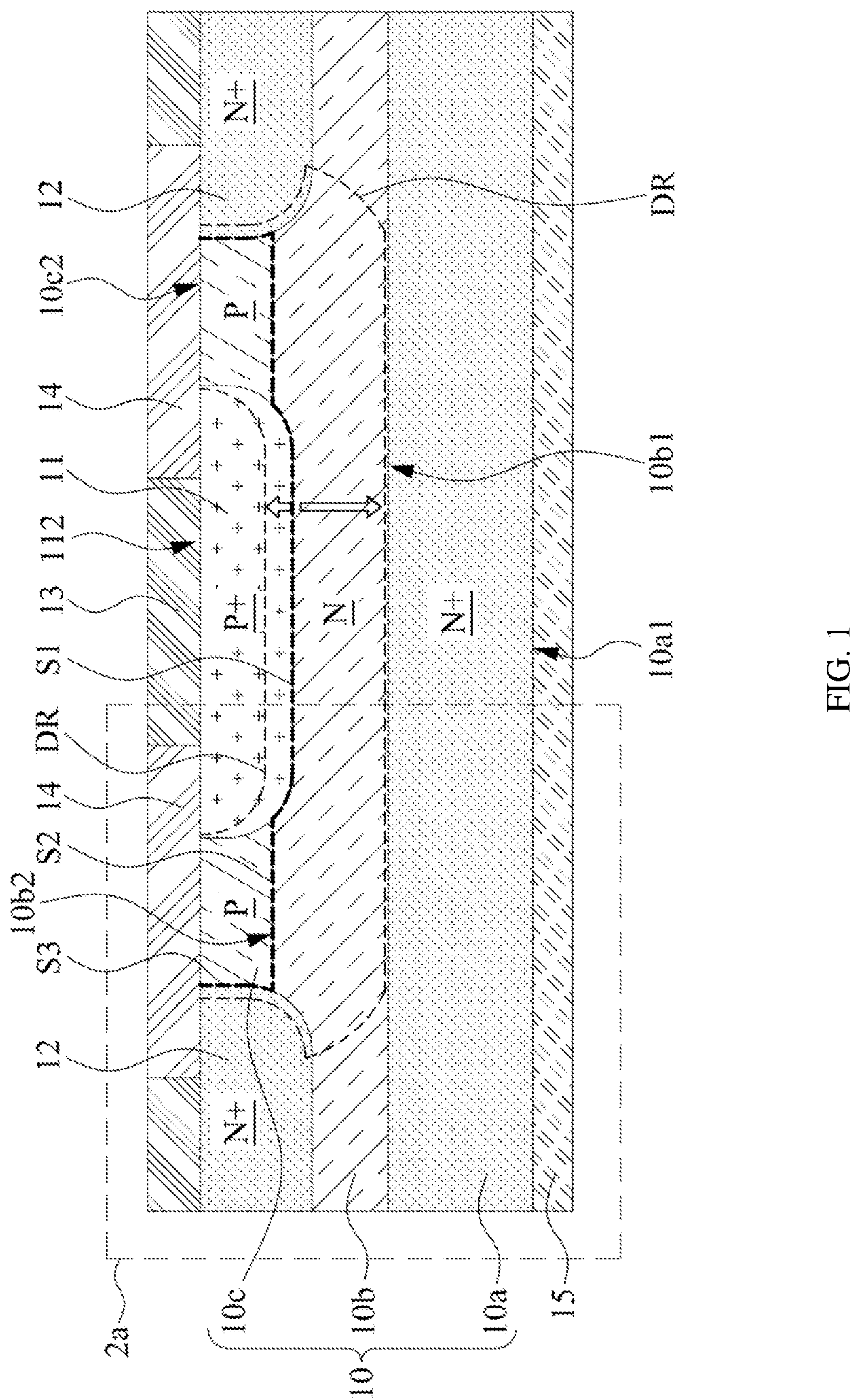
FIG. 1 is a cross-sectional view of a power diode device according to embodiments of the present disclosure.

Brief explanation of reference signs in the drawings: 1: power diode device; 2*a*: a portion of the power diode device; 10: substrate; 10*a*: diffusion layer; 10*al*: surface; 10*ah*: thickness; 10*b*: core layer; 10*b*1: surface; 10*b*2: surface; 10*b*2': surface; 10*bh*: thickness; 10*c*: diffusion layer; 10*c*2: surface; 10*ch*: thickness; 10*h*: thickness; 10*h*': thickness; 11: heavily doped region; 112: surface; 11*h*: depth; 12: isolation structure; 12*h*: depth; 13: electrode layer; 14: passivation layer; 14*a*: oxide layer; 14*b*: nitride layer; 14*c*: oxide layer; 14*d*: insulating layer; 15: electrode layer; 30: protective layer; 30*h*: opening; 31: protective layer; 31*h*: opening; 32: protective layer; D1: distance; D2: distance; DR: depleted extended region; L1: position; L2: position; P1: peak; P2: peak; S1: PN junction; S2: PN junction; S3: PN junction, X: cutting line.

The same or similar components are labeled with the same reference numerals in the drawings and detailed description. Several embodiments of the present disclosure will be readily understood from the following detailed description taken in conjunction with the accompanying drawings.

DETAILED DESCRIPTION OF ILLUSTRATIVE EMBODIMENTS

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

The following disclosure provides various different embodiments or examples for implementing different features of the presented subject matter. Specific embodiments of components and configurations are described below. Certainly, these are examples only and are not intended to be limiting. In this disclosure, references to forming a first feature over or on a second feature may include embodiments where the first and second features are formed in direct contact, and may also include embodiments where an additional feature is formed between the first feature and the second feature such that the first feature and the second feature may not be in direct contact. In addition, the present disclosure may repeat reference signs and/or letters in various embodiments. Such repetition is for simplicity and clarity and does not in itself indicate a relationship between the various embodiments and/or configurations discussed.

Embodiments of the present disclosure are discussed in detail below. It should be appreciated, however, that the present disclosure provides applicable concepts that can be embodied in a wide variety of specific contexts. The specific embodiments discussed herein are illustrative only, and do not limit the scope of the present disclosure.

The present disclosure provides a power diode device and a manufacturing method thereof. Compared with power diode devices having a mesa structure, the power diode device of the present disclosure has a higher structural strength. In addition, compared with power diode devices that form guard rings to relax the electric field distribution, the power diode device of the present disclosures is not limited by the line width capability of the process, has a shorter terminal length, and is thus conducive to reduction of the device size.

Referring to FIG. 1, FIG. 1 is a cross-sectional view of a power diode device 1 according to embodiments of the present disclosure. The power diode device 1 may include a substrate 10, a heavily doped region 11, an isolation structure 12, an electrode layer 13, a passivation layer 14 and an electrode layer 15.

The substrate 10 may include a semiconductor substrate. The substrate 10 may include a semiconductor material such as (but not limited to) silicon (Si), gallium nitride (GaN), gallium arsenide (GaAs), aluminum nitride (AlN), silicon carbide (SiC), indium phosphide (InP), zinc selenide (ZnSe) or other semiconductor materials of group VI, III-V or II-VI. In some embodiments, an N-type monocrystalline silicon wafer having a volume resistivity between about 45 and about 60 Ohm-cm may be used to form the substrate 10. The substrate 10 may include a first diffusion layer 10*a* (hereinafter referred to as a diffusion layer 10*a*), a core layer 10*b* and a second diffusion layer 10*c* (hereinafter referred to as a diffusion layer 10*c*).

The core layer 10*b* may be located between the diffusion layer 10*a* and the diffusion layer 10*c*. For example, the core layer 10*b* may be sandwiched between the diffusion layer 10*a* and the diffusion layer 10*c*. The core layer 10*b* may be a part of the original semiconductor substrate. The core layer 10*b* can be doped with N-type impurities, e.g., the region marked with "N" in FIG. 1. The N-type impurities may include pentavalent elements such as phosphorus, arsenic, antimony, and so on. In other embodiments, the core layer 10*b* may be doped with P-type impurities, such as trivalent elements, e.g., boron, aluminum, gallium, and so on. The core layer 10*b* may include a first surface 10*b*1 (hereinafter referred to as the surface 10*b*1) and a second surface 10*b*2 (hereinafter referred to as the surface 10*b*2) opposite to the surface 10*b*1. The surface 10*b*1 of the core layer 10*b* faces the diffusion layer 10*a*, and the surface 10*b*2 of the core layer 10*b* faces the diffusion layer 10*c*.

The diffusion layer 10*a* may include a semiconductor layer doped with N-type impurities. The diffusion layer 10*a* and the core layer 10*b* can have the same conductivity type, but the impurity concentration of the diffusion layer 10*a* can be higher than that of the core layer 10*b*. For this reason, the diffusion layer 10*a* is shown as a region marked with "N+" in FIG. 1. In the present disclosure, a "N+" region or "P+" region has an impurity concentration higher than its adjacent regions. The diffusion layer 10*a* may include a first surface 10*al* (hereinafter referred to as the surface 10*al*) and a second surface (not shown in the figure, which faces the surface 10*b*1 of the core layer 10*b*). The surface 10*al* of the diffusion layer 10*a* forms the bottom surface of the substrate 10.

Figure 3A:
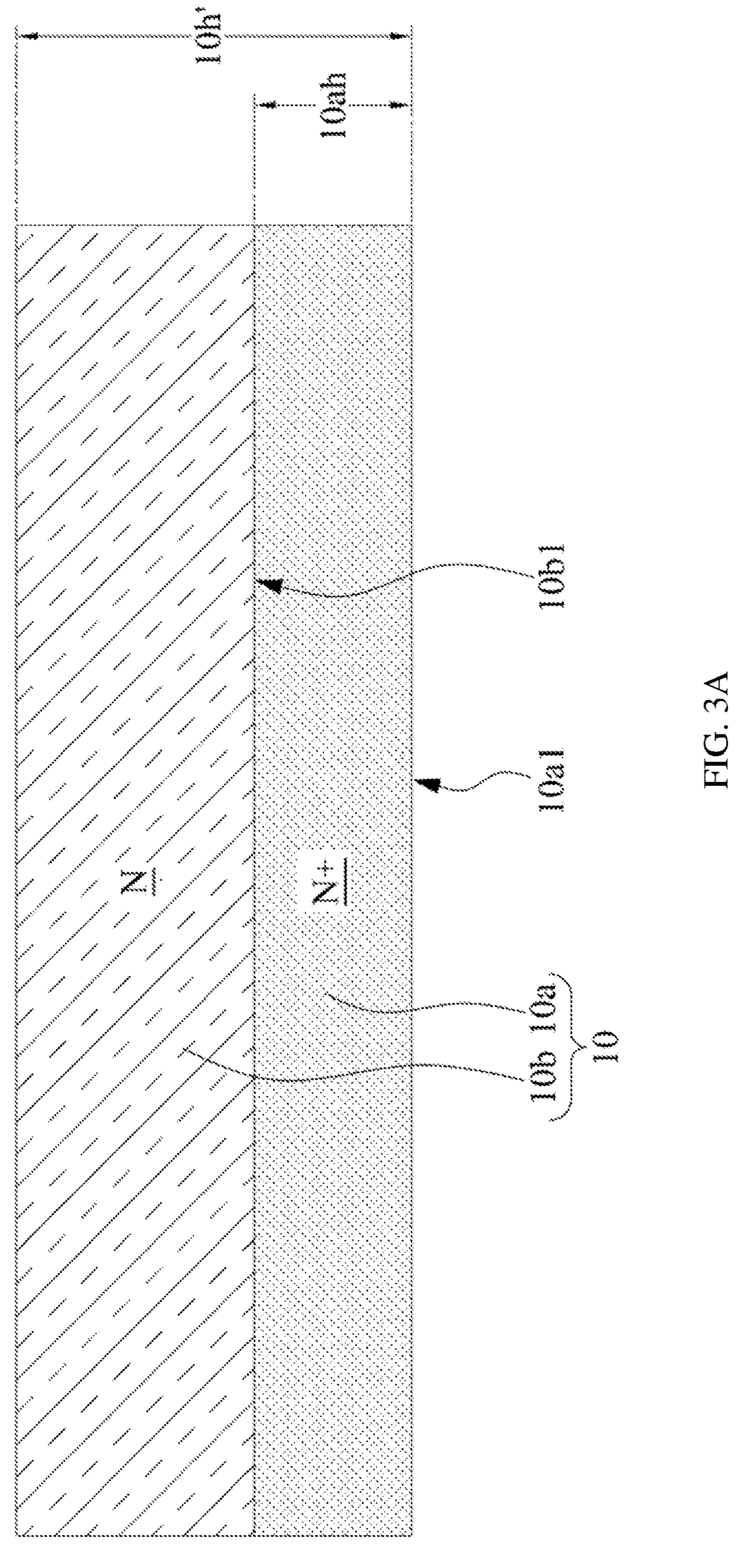
FIGS. 3A-3G are diagrams showing one or more stages in a manufacturing method of a power diode device according to embodiments of the present disclosure.

In some embodiments, the diffusion layer 10*a* may be formed by diffusing N-type impurities from the bottom surface of the substrate 10 into the core layer 10*b* (e.g., as shown in FIG. 3A). In some embodiments, a diffusion boundary may be formed between the diffusion layer 10*a* and the core layer 10*b*. In some embodiments, the diffusion boundary between the diffusion layer 10*a* and the core layer 10*b* is a boundary between a high-concentration N-type impurity (N+) region and an N-type impurity (N) region.

The diffusion layer 10*c* may include a semiconductor layer doped with P-type impurities, e.g., the region marked with "P" in FIG. 1. The diffusion layer 10*c* and the core layer 10*b* may have opposite conductivity types. The diffusion layer 10*c* and the diffusion layer 10*a* may have opposite conductivity types. The diffusion layer 10*c* may include a first surface (not shown in the figure, which faces the surface 10*b*2 of the core layer 10*b*) and an opposite second surface 10*c*2 (hereinafter referred to as the surface 10*c*2). The surface 10*c*2 of the diffusion layer 10*c* forms the top surface of the substrate 10. That is, the surface 10*c*2 of the diffusion layer 10*c* and the surface 10*al* of the diffusion layer 10*a* may be two opposite surfaces of the substrate 10.

Figure 3B:
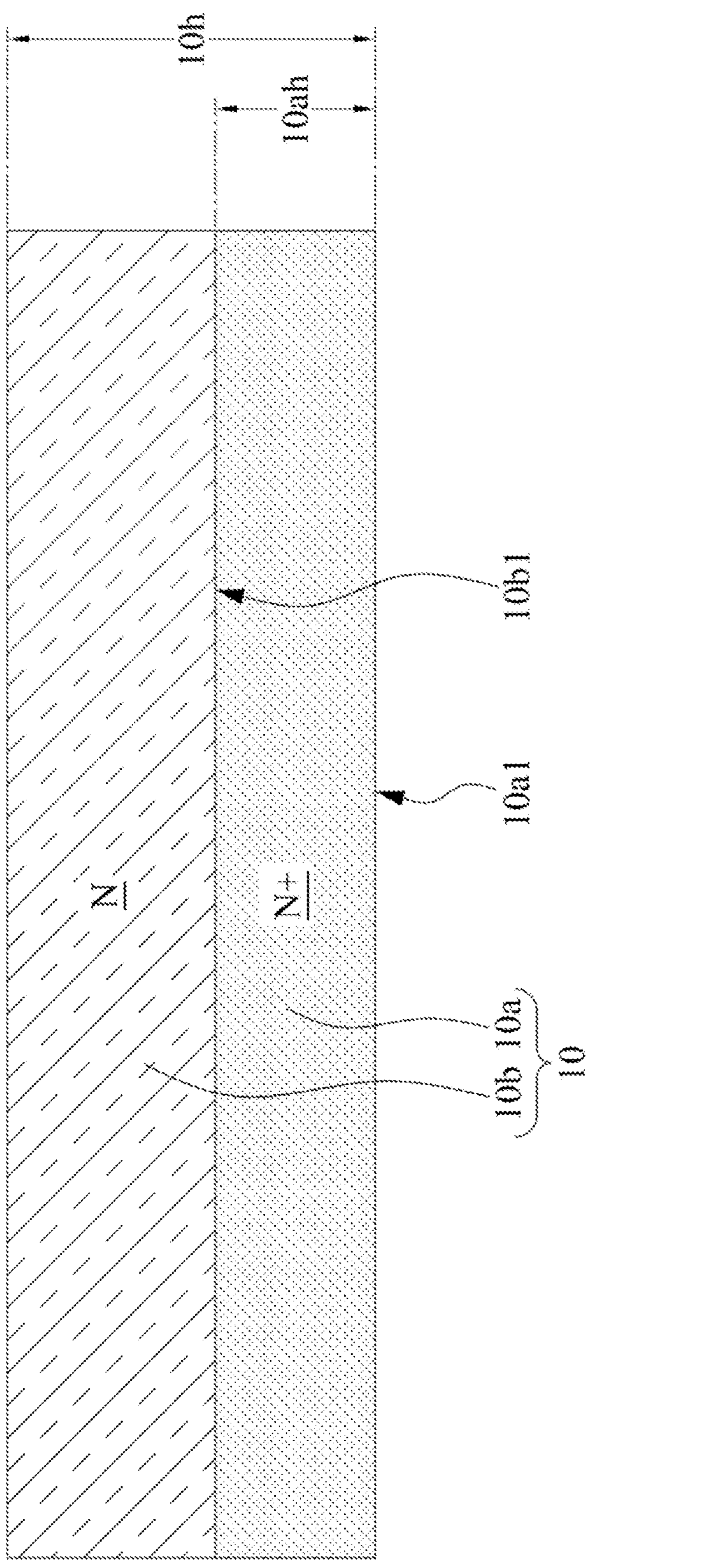
Figure 3C:
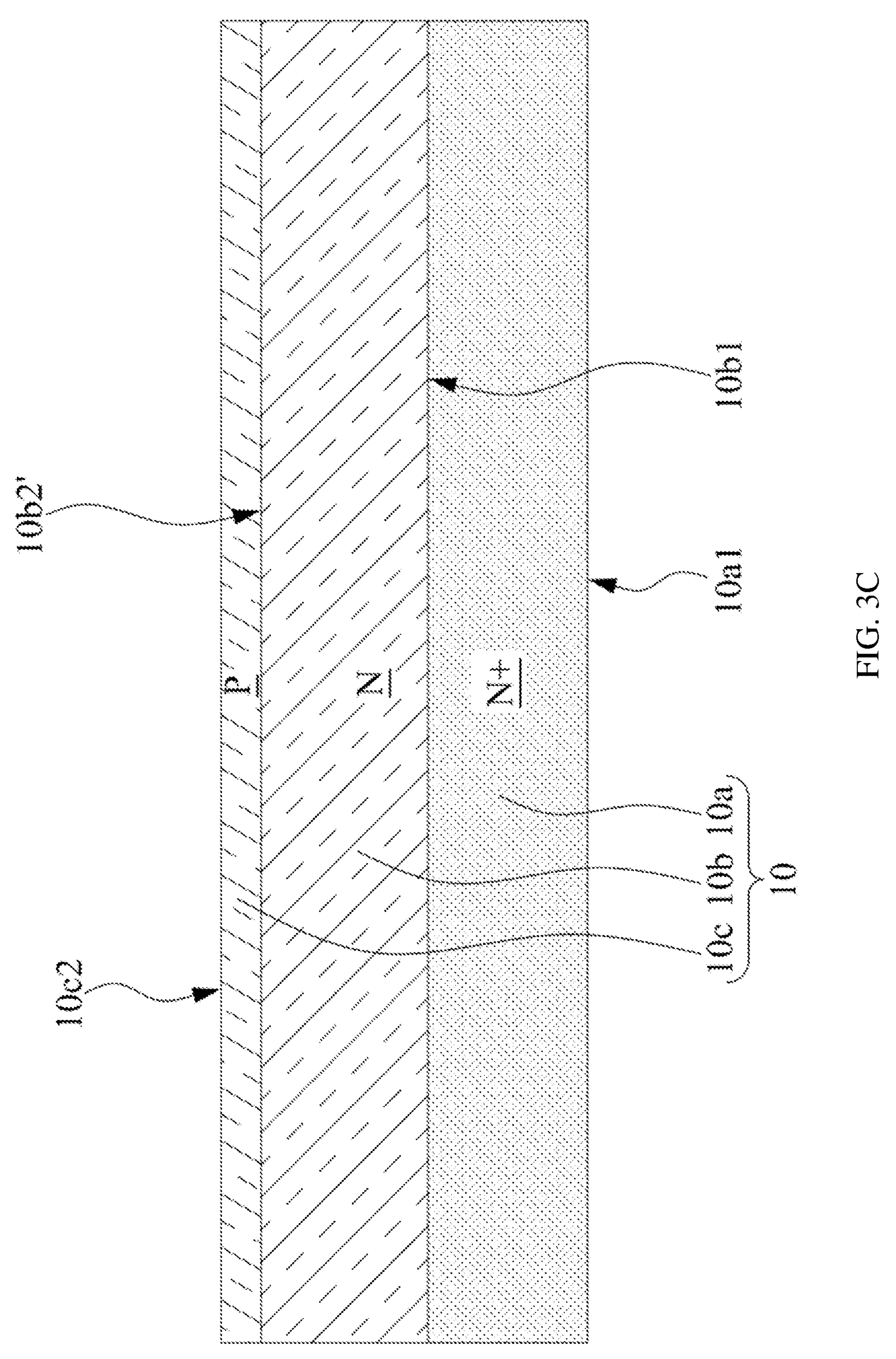
Figure 3D:
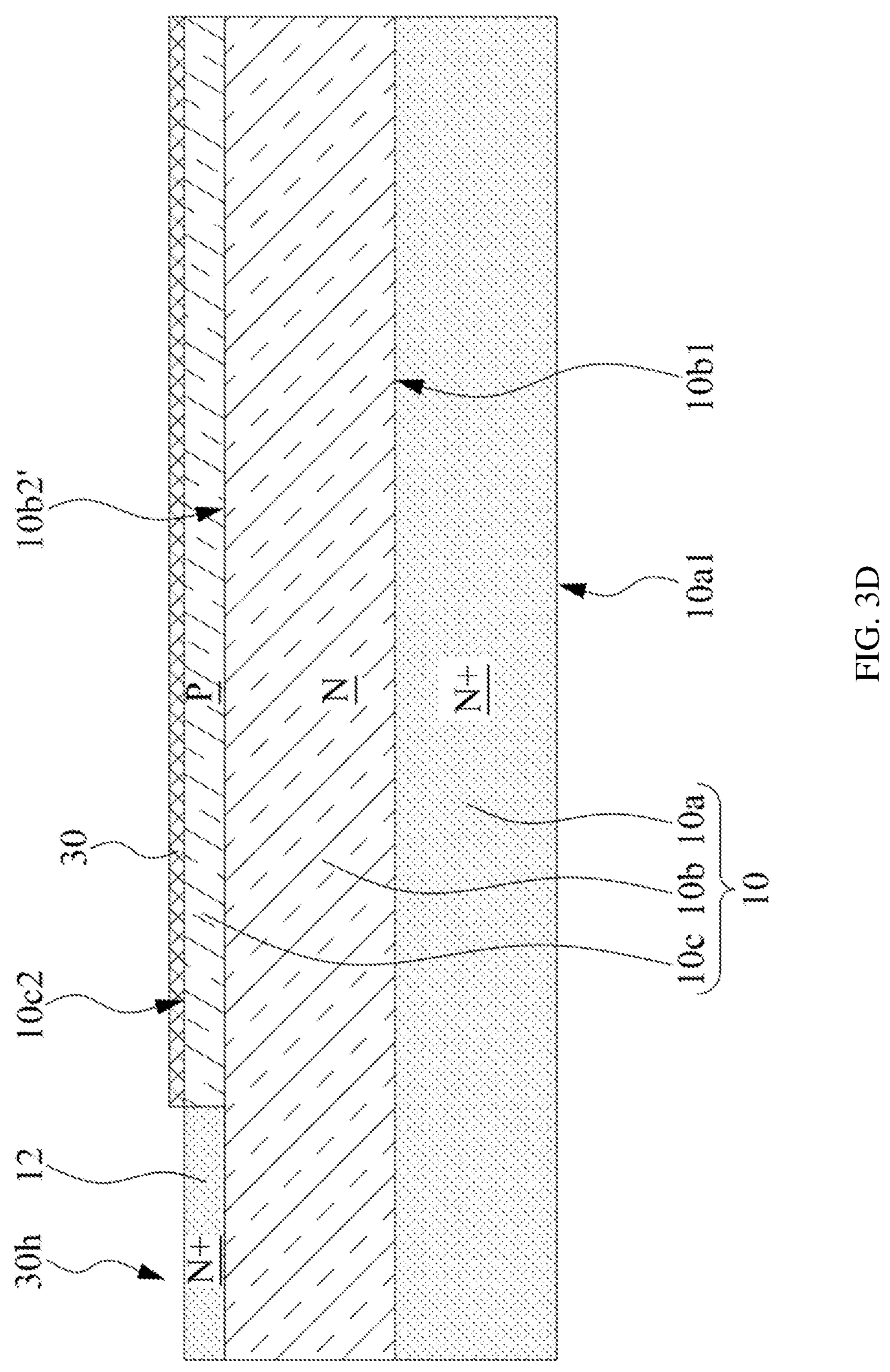
Figure 3E:
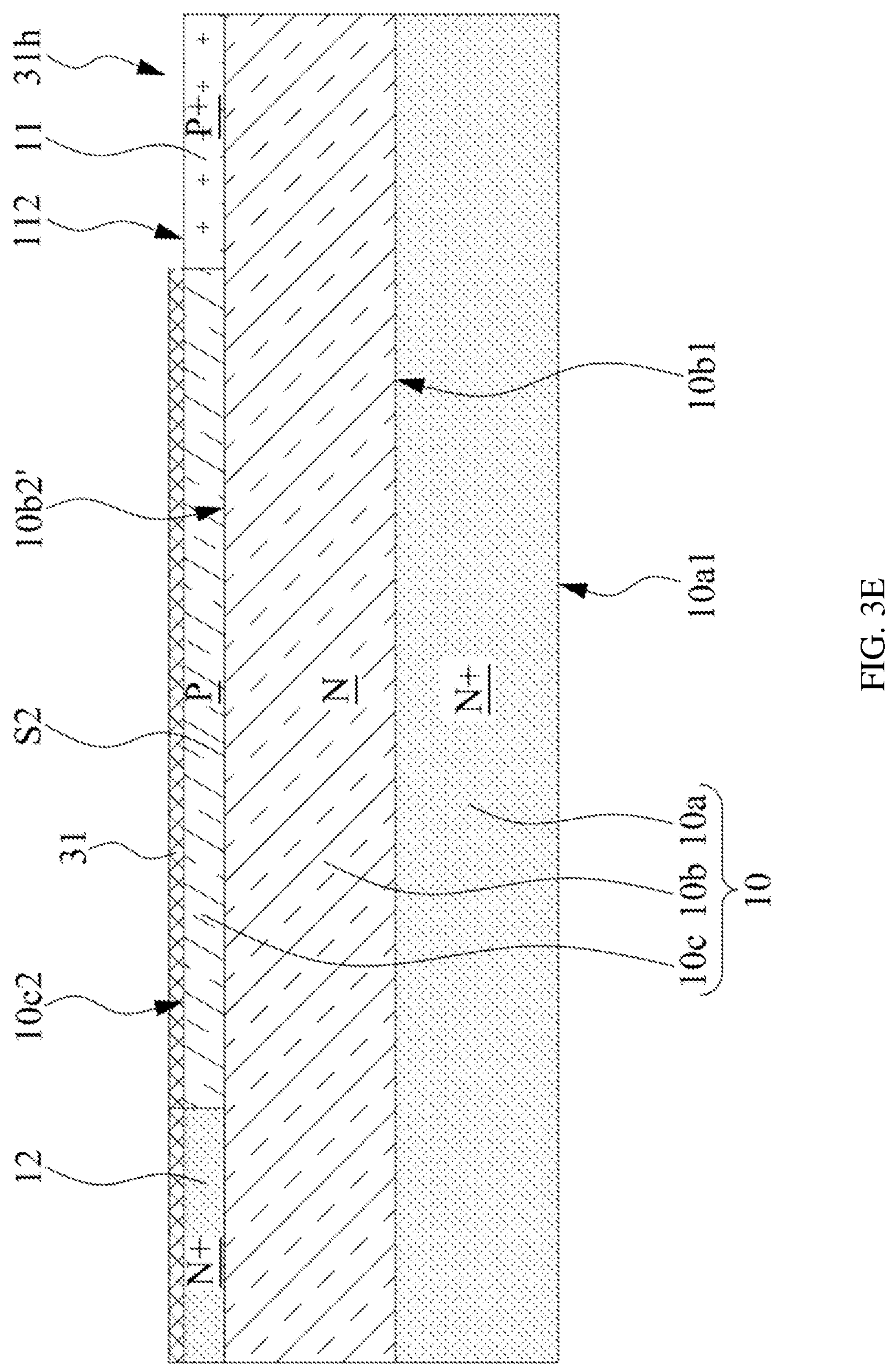
Figure 3F:
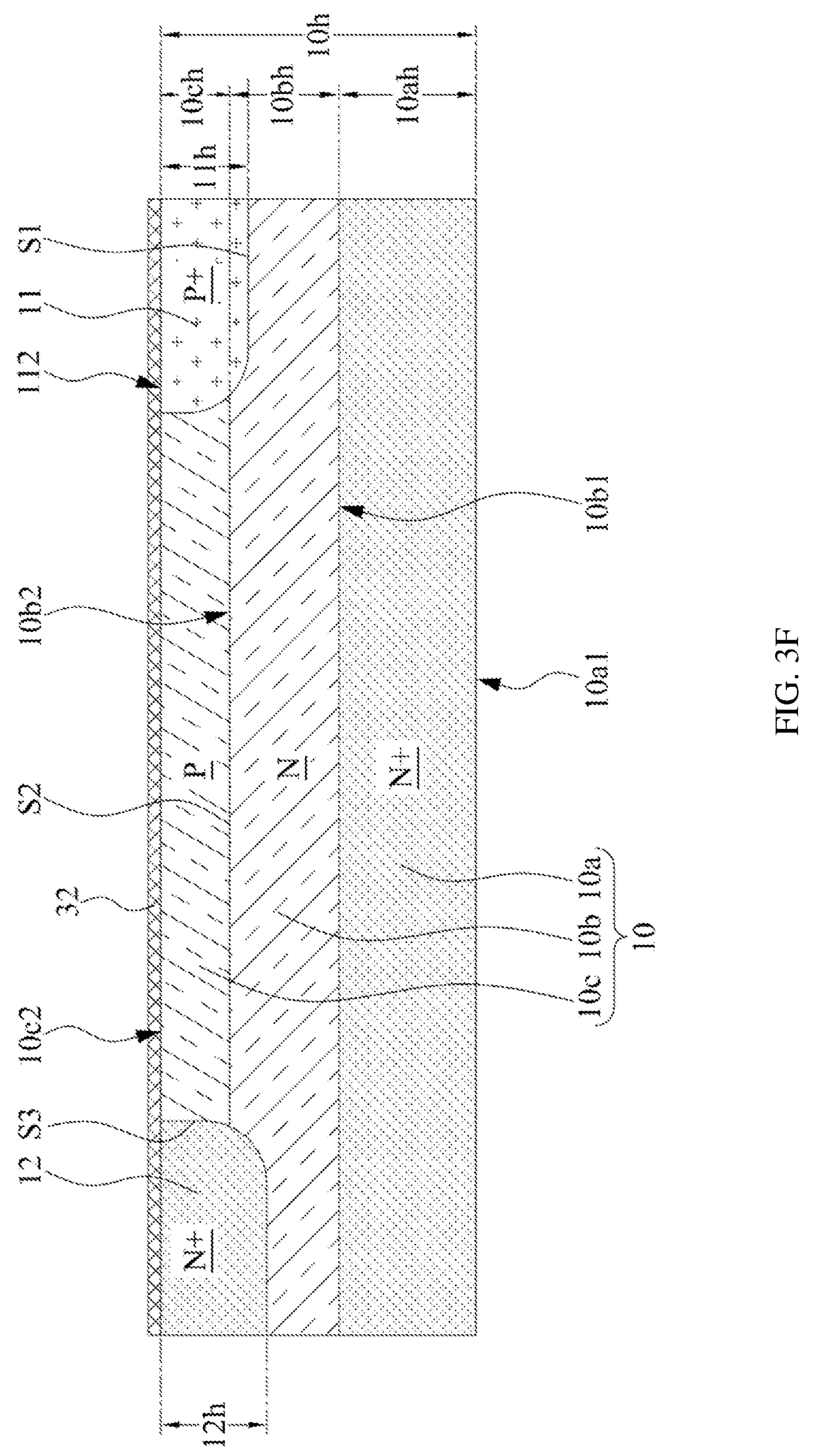

In some embodiments, the diffusion layer 10*c* may be formed by inverting a part of the N-type core layer 10*b* from the top surface of the substrate 10 to a P-type (e.g., as shown in FIG. 3C) and then performing diffusion (e.g., shown in FIG. 3F). For example, in some embodiments, the diffusion layer 10*c* may diffuse into the core layer 10*b* simultaneously with the heavily doped region 11 during the diffusion of the heavily doped region 11, and form a diffusion boundary with the core layer 10*b*. In some embodiments, the diffusion boundary between the diffusion layer 10*c* and the core layer 10*b* is a boundary between a P-type impurity (P) region and an N-type impurity (N) region or is a PN junction S2.

The heavily doped region 11 may be located in the substrate 10. In some embodiments, the heavily doped region 11 may be surrounded by the diffusion layer 10*c*. For example, the heavily doped region 11 may be located in the diffusion layer 10*c*. For example, when viewed from the cross-sectional view, the heavily doped region 11 may be located between two diffusion layers 10*c* on the left side and the right side.

The heavily doped region 11 may include a semiconductor layer doped with P-type impurities. The heavily doped region 11 and the diffusion layer 10*c* may have the same conductivity type, but the impurity concentration of the heavily doped region 11 may be higher than that of the diffusion layer 10*c*. For this reason, the heavily doped region 11 is marked as a "P+" region in FIG. 1.

In some embodiments, the heavily doped region 11 may be formed by diffusing P-type impurities from the top surface of the substrate 10 into the core layer 10*b* (e.g., as shown in FIG. 3F). In some embodiments, a diffusion boundary may be formed between the heavily doped region 11 and the core layer 10*b*. In some embodiments, the diffusion boundary between the heavily doped region 11 and the core layer 10*b* is a boundary between a P-type impurity (P) region and an N-type impurity (N) region or a PN junction S1.

In some embodiments, the PN junction S1 between the heavily doped region 11 and the core layer 10*b* may be referred to as the first PN junction, and the PN junction S2 between the diffusion layer 10*c* and the core layer 10*b* may be referred to as the second PN junction. In some embodiments, the PN junction S2 and the PN junction S1 may be continuous junctions. In some embodiments, the PN junction S1 protrudes over the PN junction S2 in the direction from the top surface of the substrate 10 to the bottom surface of the substrate 10.

The heavily doped region 11 may include a first surface (located at the same position as the PN junction S1) and an opposite second surface (hereinafter referred to as the surface 112). The surface 112 may be coplanar with surface 10*c*2 of diffusion layer 10*c*. In other words, the surface 112 can be coplanar with the top surface of the substrate 10.

In some embodiments, the heavily doped region 11 may extend toward the core layer 10*b*, and its first surface (located at the same position as the PN junction S1) may reach the surface 10*b*2 of the core layer 10*b*. For example, the PN junction S1 may be coplanar with the surface 10*b*2 of the core layer 10*b*. In some embodiments, the heavily doped region 11 may extend toward the core layer 10*b*, and its first surface (located at the same position as the PN junction S1) may reach in-between the surface 10*b*2 and the surface 10*b*1 of the core layer 10*b*, but without reaching the surface 10*b*1. For example, the PN junction S1 may be located between the surface 10*b*2 and the surface 10*b*1 of the core layer 10*b*. For example, the PN junction S1 may extend beyond the surface 10*b*2 but not beyond the surface 10*b*1.

The isolation structure 12 may be located in the substrate 10. The isolation structure 12 may include a semiconductor layer doped with N-type impurities. The isolation structure 12 and the core layer 10*b* may have the same conductivity type, but the impurity concentration of the isolation structure 12 may be higher than the impurity concentration of the core layer 10*b*, and for this reason, the isolation structure 12 is marked as a "N+" region in FIG. 1.

In some embodiments, the isolation structure 12 may surround the diffusion layer 10*c*. In some embodiments, the isolation structure 12 may surround the heavily doped region 11. For example, when viewed from the cross-sectional view, the heavily doped region 11 may be located between two isolation structures 12 on the left and right sides. The diffusion layer 10*c* may separate the heavily doped region 11 from the two isolation structures 12 on the left and right sides. For example, a diffusion layer 10*c* may be located between the heavily doped region 11 and an isolation structure 12.

In some embodiments, the isolation structure 12 may be formed by diffusing N-type impurities from the top surface of the substrate 10 into the core layer 10*b* (e.g., as shown in FIG. 3F). In some embodiments, a diffusion boundary may be formed between the isolation structure 12 and the diffusion layer 10*c*. In some embodiments, the diffusion boundary between the isolation structure 12 and the diffusion layer 10*c* may be a boundary between an N-type impurity (N) region and a P-type impurity (P) region or a PN junction S3. In some embodiments, the PN junction S3 between the isolation structure 12 and the diffusion layer 10*c* may be referred to as the third PN junction. In some embodiments, the PN junction S3 and the PN junction S2 may be continuous junctions.

In some embodiments, a diffusion boundary may be formed between the isolation structure 12 and the core layer 10*b*. In some embodiments, the diffusion boundary between the isolation structure 12 and the core layer 10*b* is a boundary between a high-concentration N-type impurity (N+) region and an N-type impurity (N) region.

In some embodiments, the isolation structure 12 and the heavily doped region 11 may be diffused simultaneously. For example, the isolation structure 12 and the heavily doped region 11 may be formed in the same step. In some embodiments, the isolation structure 12 may extend toward the core layer 10*b*, and one surface of the isolation structure 12 may reach the surface 10*b*2 of the core layer 10*b*. For example, the diffusion boundary between the isolation structure 12 and the core layer 10*b* may be coplanar with the surface 10*b*2 of the core layer 10*b*. In some embodiments, the isolation structure 12 may extend toward the core layer 10*b*, and one surface of the isolation structure 12 may reach in-between the surface 10*b*2 and the surface 10*b*1 of the core layer 10*b* without reaching the surface 10*b*1. For example, the diffusion boundary of the isolation structure 12 and the core layer 10*b* may be located in-between the surface 10*b*2 and the surface 10*b*1 of the core layer 10*b*. For example, the diffusion boundary of the isolation structure 12 and the core layer 10*b* may go beyond the surface 10*b*2 but not beyond the surface 10*b*1.

The electrode layer 15 (or referred to as the first electrode layer 15) may be located on the bottom surface of the substrate 10. For example, the electrode layer 15 may be disposed on the surface 10*al* of the diffusion layer 10*a*. For example, the electrode layer 15 may be in contact with or cover a portion of the diffusion layer 10*a*. For example, the electrode layer 15 may completely cover the surface 10*al* of the diffusion layer 10*a*. The electrode layer 15 may be regarded as an electrical terminal of the power diode device 1. For example, the electrode layer 15 may be electrically connected to an electrical terminal of the power diode device 1.

The electrode layer 13 (or referred to as the second electrode layer 13) may be located on the top surface of the substrate 10. For example, the electrode layer 13 may be disposed on the surface 112 of the heavily doped region 11. For example, the electrode layer 13 may be in contact with or cover a portion of the heavily doped region 11. For example, the electrode layer 13 may be in contact with or cover a portion of the isolation structure 12. The electrode layer 13 may be regarded as an electrical terminal of the power diode device 1. For example, the electrode layer 13 may be electrically connected to an electrical terminal of the power diode device 1. The substrate 10 may be sandwiched between the electrode layer 15 and the electrode layer 13.

In some embodiments, when viewed from the cross-sectional view, the width of the electrode layer 15 may be greater than the width of the electrode layer 13. In some embodiments, the total surface area of the electrode layer 15 may be greater than the total surface area of the electrode layer 13.

In some embodiments, the electrode layer 15 and the electrode layer 13 may include copper (Cu), gold (Au), silver (Ag), aluminum (Al), nickel (Ni), titanium (Ti), tungsten (W), Tin (Sn), or other metals or alloys. In some embodiments, the electrode layer 15 and the electrode layer 13 may include the same material, such as aluminum. In some embodiments, the electrode layer 15 and the electrode layer 13 may include different materials, for example, the electrode layer 15 is aluminum, and the electrode layer 13 is silver, nickel, or titanium.

A passivation layer 14 may be located on the top surface of the substrate 10. For example, the passivation layer 14 may be disposed on the surface 112 of the heavily doped region 11. For example, the passivation layer 14 may be disposed on the surface 10*c*2 of the diffusion layer 10*c*. For example, the passivation layer 14 may be in contact with or cover a portion of the surface 112 of the heavily doped region 11. For example, the passivation layer 14 may be in contact with or cover a portion of the surface 10*c*2 of the diffusion layer 10*c*. For example, the passivation layer 14 may completely cover the surface 10*c*2 of the diffusion layer 10*c*. For example, the passivation layer 14 may be in contact with or cover a portion of the isolation structure 12.

In some embodiments, the passivation layer 14 may surround the electrode layer 13. For example, when viewed from the cross-sectional view, the electrode layer 13 may be located between the two passivation layers 14 on the left side and right side. In some embodiments, the passivation layer 14 and the electrode layer 13 may be coplanar. However, in other embodiments, the passivation layer 14 and the electrode layer 13 may not be coplanar. For example, the edges of the passivation layer 14 may be covered by the electrode layer 13. For example, in the direction from the top surface of the substrate 10 to the bottom surface of the substrate 10, the passivation layer 14 and the electrode layer 13 may overlap each other.

In some embodiments, the diffusion layer 10*c* may serve as a reduced surface field (RESURF) layer. For example, the diffusion layer 10*c* may have a more uniform electric field distribution to increase the breakdown voltage of the power diode device 1.

In some embodiments, the diffusion layer 10*c* and the core layer 10*b* may serve as a depletion extension region DR. The diffusion layer 10*c* and the core layer 10*b* may relax the electric field originally concentrated between the heavily doped region 11 and the isolation structure 12. For example, since the impurity doping concentration of the diffusion layer 10*c* and the core layer 10*b* is lower than that of the isolation structure 12, when the power diode device 1 is reversely biased, the carriers in the diffusion layer 10*c* and the core layer 10*b* will be depleted, and the depleted extended region DR will become wider, thereby increasing the breakdown voltage of the power diode device 1. In other words, according to different voltage withstand requirements, the length of the diffusion layer 10*c* may be adjusted in order to relax the electric field intensity.

Figure 2A:
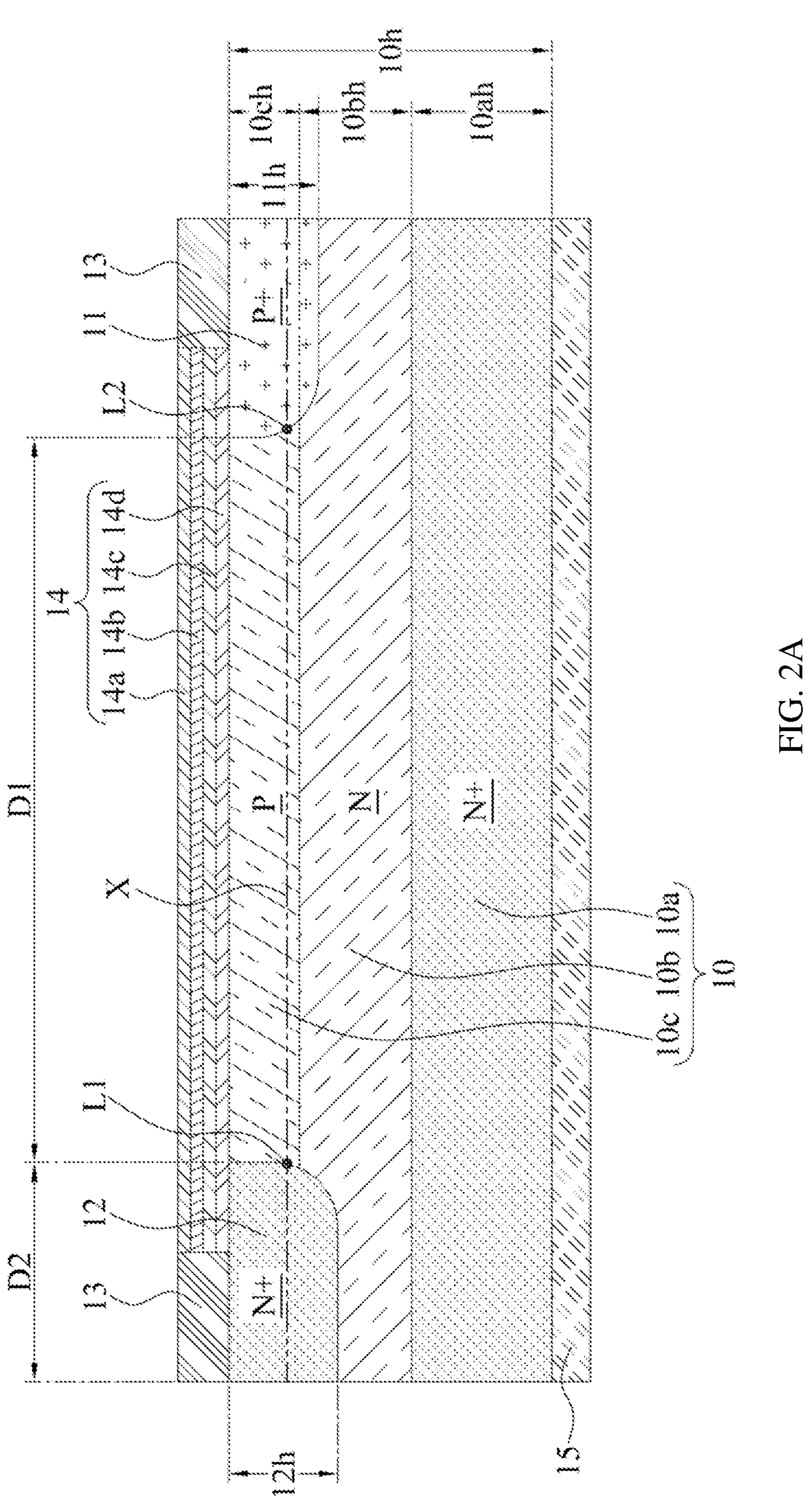
FIG. 2A is a diagram depicting an enlarged view of a portion of a power diode device according to embodiments of the present disclosure.

FIG. 2A shows an enlarged view of a portion of the power diode device 1. Specifically, FIG. 2A depicts a portion 2*a* of the power diode device in FIG. 1. The same or similar components in FIG. 2 and FIG. 1 are indicated using the same symbol, and the detailed description of these components will not be repeated.

In some embodiments, the thickness 10*h* of the substrate 10 may be between about 240 micrometers (μm) and about 280 μm, e.g., may be about 260 μm. In some embodiments, the thickness 10*ah* of the diffusion layer 10*a* may be between about 110 μm and about 150 μm, e.g., about 130 μm. In some embodiments, the thickness 10*bh* of the core layer 10*b* may be between about 80 μm and about 120 μm, e.g., about 100 μm. In some embodiments, the thickness 10*ch* of the diffusion layer 10*c* may be between about 10 μm and about 50 μm, e.g., about 30 μm.

In some embodiments, the thickness 10*ch* of the diffusion layer 10*c* may be different from the thickness 10*bh* of the core layer 10*b*. For example, the thickness 10*ch* of the diffusion layer 10*c* may be smaller than the thickness 10*bh* of the core layer 10*b*. For example, the thickness 10*bh* of the core layer 10*b* may be more than three times the thickness 10*ch* of the diffusion layer 10*c*.

In some embodiments, the thickness 10*ch* of the diffusion layer 10*c* may be different from the thickness 10*ah* of the diffusion layer 10*a*. For example, the thickness 10*ch* of the diffusion layer 10*c* may be smaller than the thickness 10*ah* of the diffusion layer 10*a*. For example, the thickness 10*ah* of the diffusion layer 10*a* may be more than four times the thickness 10*ch* of the diffusion layer 10*c*.

In some embodiments, the depth 11*h* of the heavily doped region 11 may be between about 10 μm and about 50 μm, e.g., about 30 μm. In some embodiments, the depth 12*h* of the isolation structure 12 may be between about 30 m and about 70 m, e.g., about 50 m. In some embodiments, the depth 12*h* of the isolation structure 12 may be greater than the depth 11*h* of the heavily doped region 11. For example, the isolation structure 12 and the heavily doped region 11 may be diffused simultaneously (e.g., as shown in FIG. 3F), and the carrier diffusion speed of the isolation structure 12 may be faster than that of the heavily doped region 11.

In some embodiments, the depth 11*h* of the heavily doped region 11 and the thickness 10*ch* of the diffusion layer 10*c* may be approximately equal. In some embodiments, the depth 11*h* of the heavily doped region 11 may be greater than the thickness 10*ch* of the diffusion layer 10*c*. In some embodiments, making the thickness 10*ch* of the diffusion layer 10*c* smaller than the thickness 10*bh* of the core layer 10*b* may increase the process cost. However, by controlling the thickness 10*ch* of the diffusion layer 10*c* to be between about 10 μm and about 50 μm (e.g., about 30 μm), so that the heavily doped region 11 may be diffused into the core layer 10*b*, the surge capacity of the power diode device 1 can be improved.

In some embodiments, the distance D1 between the heavily doped region 11 and the isolation structure 12 may be between about 160 μm and about 140 μm, for example, about 150 μm. In some embodiments, the breakdown voltage may be adjusted by adjusting the distance D1. The higher the required breakdown voltage is, the larger the distance D1 needs to be. In some embodiments, the isolation structures 12 may serve as cutting routes. In some embodiments, the distance D2 of the isolation structure 12 may be approximately 2.5 mil or 63.5 μm.

In some embodiments, the passivation layer 14 may include a laminated structure having a plurality of layers. For example, the passivation layer 14 may include an oxide layer 14*a*, a nitride layer 14*b*, an oxide layer 14*c*, and an insulating layer 14*d*. The oxide layer 14*a* and the oxide layer 14*c* may include a low temperature oxide (LTO) layer. The oxide layer 14*a* and the oxide layer 14*c* may be configured as stress buffer layers. The nitride layer 14*b* may include silicon nitride ($Si_3N_4$). The nitride layer 14*b* may be configured as a moisture or pollution barrier. The insulating layer 14*d* may include a semi-insulating polycrystalline silicon (SIPOS) layer. The insulating layer 14*d* may be configured to remove surface charges, for example, to prevent carriers from accumulating on the surface of the power diode device to generate leakage current.

Figure 2B:
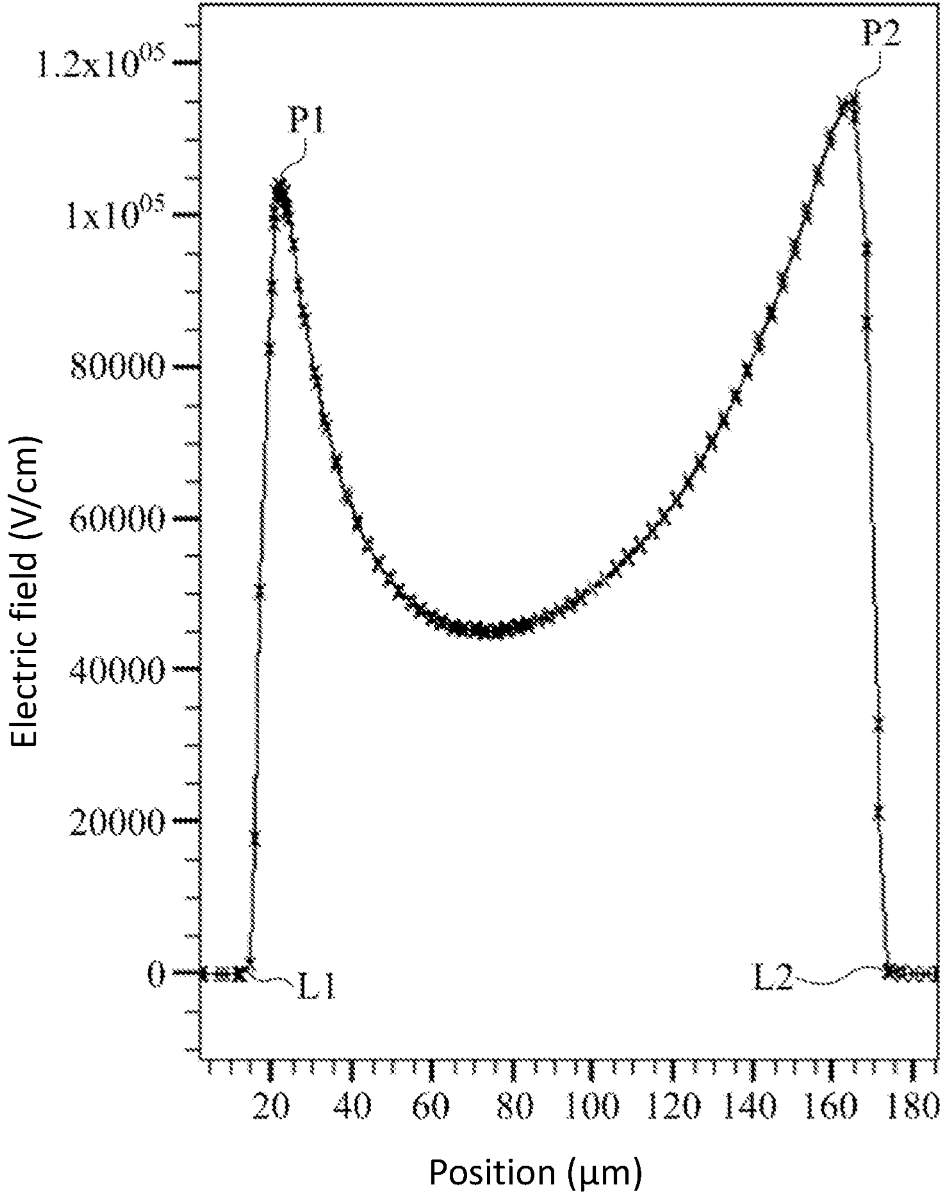
FIG. 2B is a graph depicting electric field intensity of the power diode element in FIG. 2A along a cutting line X.

FIG. 2B shows a curve of an electric field intensity of the portion 2*a* of the power diode device along the line X-X in FIG. 2A. The X-axis represents the positions along the line X-X, and the unit is m; the Y-axis represents the electric field intensity, and the unit is volt/meter (V/m). The position L1 in FIG. 2B corresponds to the position L1 in FIG. 2A, and the position L2 in FIG. 2B corresponds to the position L2 in FIG. 2A. The electric field peak value P1 is $1.05\times10^5$ V/m, and its position is close to the junction between the isolation structure 12 and the diffusion layer 10*c*. The electric field peak value P2 is $1.2\times10^5$ V/m, and its position is close to the junction between the diffusion layer 10*c* and the heavily doped region 11. The electric field peak value P2 is greater than the electric field peak value P1. That is, the electric field close to the junction between the diffusion layer 10*c* and the heavily doped region 11 is greater than the electric field close to the junction between the isolation structure 12 and the diffusion layer 10*c*.

The above-mentioned embodiments relate to power diode devices made of N-type monocrystalline silicon wafers. It should be known that power diode devices made of P-type monocrystalline silicon wafers with opposite doping types are also within the protection scope of the present disclosure. In one embodiment, the first conductivity type refers to doping with N-type impurities, and the second conductivity type refers to doping with P-type impurities. In another embodiment, the first conductivity type refers to doping with P-type impurities, and the second conductivity type refers to doping with N-type impurities.

Referring to FIG. 3A to FIG. 3G, FIG. 3A to FIG. 3G are schematic diagrams of an embodiment manufacturing method of a power diode device 1. Similar to FIG. 2A, in the embodiments of FIG. 3A to FIG. 3G, the structures of the portion 2*a* of the power diode device in FIG. 1 in various stages are used for exemplary illustration. Therefore, the same or similar components in FIG. 3A to FIG. 3G and FIG. 1 are marked with the same symbol, and the detailed description of these components will not be repeated. At least some of these drawings have been simplified to facilitate a better understanding of aspects of the present disclosure.

Referring to FIG. 3A, the manufacturing method includes forming a diffusion layer 10*a* in a substrate 10. The substrate 10 may include a semiconductor substrate doped with N-type or P-type impurities. In the embodiments shown from FIG. 3A to FIG. 3G and in the following descriptions, an N-type silicon wafer is used as the substrate 10, as an example. In some embodiments, the thickness 10*h*' of the substrate 10 may be between about 480 μm and about 520 μm. In some embodiments, an N-type silicon wafer with a volume resistivity between about 45 and about 60 Ohm-cm may be used.

In some embodiments, a backside diffusion technique may be used to diffuse the N-type impurities from the bottom surface of the substrate 10. For example, phosphor paper may be attached to the bottom surface of the substrate 10 and then diffusion is performed, so as to advance the diffusion boundary and form a deeper N+ layer. In some embodiments, diffusion may be performed at a temperature of about 1280° C. (Celsius) for about 22 hours. In some embodiments, the thickness 10*ah* of the diffusion layer 10*a* may be between about 110 μm and about 150 μm, e.g., about 130 μm. The remaining portion of the substrate 10 may be used to form the core layer 10*b*. In some embodiments, the surface 10*al* of the diffusion layer 10*a* may form the bottom surface of the substrate 10, and a diffusion boundary (located at the same position as the surface 10*b*1 of the core layer 10*b*) may be formed between the diffusion layer 10*a* and the core layer 10*b*. In other embodiments, a gaseous or liquid N-type impurity diffusion source may also be used.

In other embodiments, a double-side diffusion technology may be used to diffuse N-type impurities from the top and bottom surfaces of the substrate 10. A N+/N/N+ structure may be formed after the substrate 10 is diffused from both surfaces. The remaining portion of the substrate 10 may be used to form the core layer 10*b*. For example, the core layer 10*b* may be sandwiched by the upper and lower diffusion layers having higher impurity concentrations.

Referring to FIG. 3B, the manufacturing method may include grinding and polishing the substrate 10, and removing a portion of the core layer 10*b*, such that the thickness 10*h* of the substrate 10 is reduced to between about 240 μm and about 280 μm, e.g., about 260 μm.

In other embodiments, when N-type impurities are diffused from the top and bottom surfaces of the substrate 10 using the double-sided diffusion technology, the manufacturing method may include grinding and polishing the substrate 10 to remove one diffusion layer to expose the core layer 10*b*, and to reduce the thickness 10*h* of the substrate 10 to between about 240 μm and about 280 μm, e.g., about 260 μm.

Referring to FIG. 3C, the manufacturing method may include forming a diffusion layer 10*c* in the substrate 10. Taking boron as an example, liquid source diffusion, solid source diffusion or ion implantation may be used to invert a portion of the core layer 10*b* from N-type to P-type. In some embodiments, the ion implantation method may be used. In some embodiments, the diffusion layer 10*c* may be formed through annealing, oxidation, and diffusion. In some embodiments, before forming the diffusion layer 10*c*, an oxide layer may be formed on the core layer 10*b* as a buffer layer, to avoid generating defects during the ion implantation. In some embodiments, the surface 10*c*2 of the diffusion layer 10*c* may form the top surface of the substrate 10, and a diffusion boundary (located at the same position as the surface 10*b*2' of the core layer 10*b*) may be formed between the diffusion layer 10*c* and the core layer 10*b*.

Referring to FIG. 3D, the manufacturing method may include forming an isolation structure 12 in the substrate 10. In some embodiments, a protective layer 30, such as a mask or a photomask, may be formed on the surface 10*c*2 of the diffusion layer 10*c*. An opening 30*h* may be formed in the protective layer 30 to define a location where the isolation structure 12 is formed. In some embodiments, using phosphorus as an example, phosphorus oxychloride ($POCl_3$) may be used as the phosphorus source for pre-deposition. Afterwards, main diffusion may be performed on the pre-deposited substrate 10 to advance the diffusion boundary and form a deeper N+ layer. Same as the diffusion layer 10*a*, the isolation structure 12 may permeate through phosphor paper, or gaseous or liquid N-type impurity diffusion sources.

Referring to FIG. 3E, the manufacturing method may include forming a heavily doped region 11 in the substrate 10. In some embodiments, the protective layer 30 may be removed. The protective layer 30 may be removed by using etching, stripping or other suitable processes. A protective layer 31, such as a mask or photomask, may be formed on the surface 10*c*2 of the diffusion layer 10*c*. An opening 31*h* may be formed in the protective layer 31 to define a position where the heavily doped region 11 is formed. In some embodiments, using boron as an example, boron trichloride ($BCl_3$) may be used as the boron source for pre-deposition. Afterwards, main diffusion is performed on the pre-deposited substrate 10 to advance the diffusion boundary and form a deeper P+ layer. The heavily doped region 11 may include a surface 112. In some embodiments, the surface 112 may be coplanar with the surface 10*c*2. The surface 112 may be coplanar with the top surface of the substrate 10.

Referring to FIG. 3F, the manufacturing method may include diffusing the heavily doped region 11 toward the core layer 10*b*. In some embodiments, the heavily doped region 11 may be diffused toward the core layer 10*b*, such that one surface of the heavily doped region 11 can reach the surface 10*b*2 of the core layer 10*b* or reach in-between the surface 10*b*2 and the surface 10*b*1 of the core layer 10*b* without reaching the surface 10*b*1. In some embodiments, the heavily doped region 11 may be diffused toward the core layer 10*b* to form a PN junction S1 between the heavily doped region 11 and the core layer 10*b*.

In some embodiments, the protective layer 31 may be removed. The protective layer 31 may be removed by using etching, stripping or other suitable processes. A protective layer 32, such as a mask or photomask, may be formed on the surface 10*c*2 of the diffusion layer 10*c* and the surface 112 of the heavily doped region 11. In some embodiments, diffusion may be performed at a temperature of about 1250° C. for about 15 hours.

In some embodiments, the diffusion layer 10*c* and the heavily doped region 11 may be diffused simultaneously. For example, the diffusion layer 10*c* and the heavily doped region 11 may be formed in the same step. In some embodiments, the diffusion layer 10*c* may be diffused toward the core layer 10*b*, and a surface 10*b*2' between the diffusion layer 10$c$ and the core layer 10$b$ (as shown in FIG. 3E) moves downward to become the surface 10$b$2, which may form a PN junction S2.

In some embodiments, the PN junction S2 and the PN junction S1 may be continuous junctions. In some embodiments, the PN junction S1 protrudes over the PN junction S2 in the direction from the top surface of the substrate 10 to the bottom surface of the substrate 10.

In some embodiments, the isolation structure 12 and the heavily doped region 11 may be diffused simultaneously. For example, the isolation structure 12 and the heavily doped region 11 may be formed in the same step. In some embodiments, the isolation structure 12 may be diffused toward the core layer 10$b$, and one surface thereof may reach the surface 10$b$2 of the core layer 10$b$ or reach in-between the surface 10$b$2 and the surface 10$b$1 of the core layer 10$b$ but not reach the surface 10$b$1. In some embodiments, the carrier diffusion speed of the isolation structure 12 may be faster than that of the heavily doped region 11, and thus the depth 12$h$ of the isolation structure 12 may be greater than the depth 11$h$ of the heavily doped region 11.

Figure 3G:
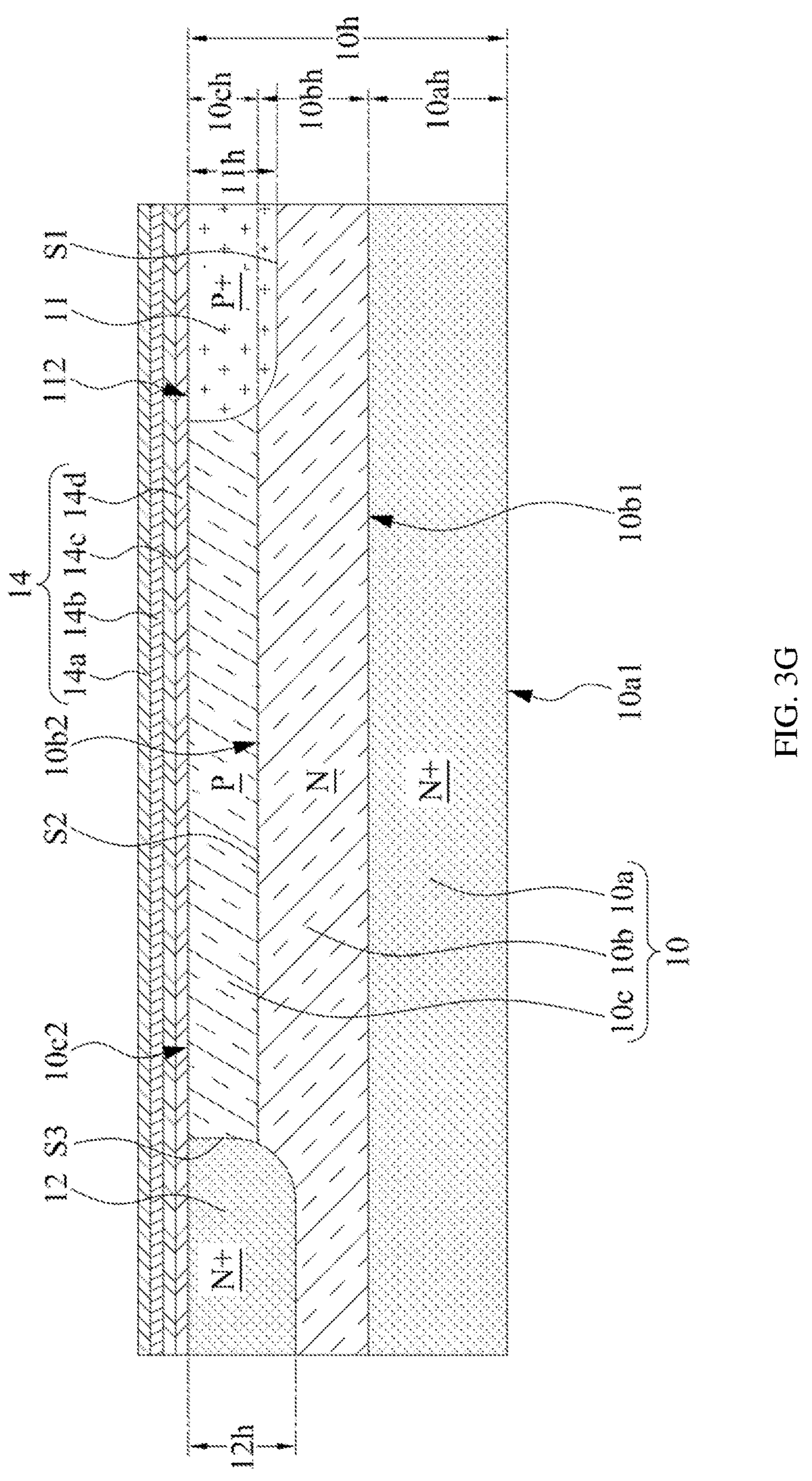

Referring to FIG. 3G, the manufacturing method may include forming a passivation layer 14 on the top surface of the substrate 10. In some embodiments, the protective layer 32 may be removed. The protective layer 32 may be removed by using etching, stripping or any other suitable processes.

Thereafter, an electrode layer 13 and an electrode layer 15 may be formed on the top and bottom surfaces of the substrate 10, respectively, by using a metal mask (not shown). In some embodiments, the electrode layer 13 and the electrode layer 15 may be formed by using sputtering, electroless plating, electroplating, printing or other suitable processes. The metal mask may be removed by using etching, stripping or other suitable processes. The semiconductor structure formed through the above steps may be the similar to the portion 2$a$ of the power diode device in FIG. 2A.

The embodiment manufacturing method of the power diode device may use an N-type (or P-type) monocrystalline silicon wafer to form the diffusion layer 10$c$. Compared with using an epitaxial layer, the cost of forming the diffusion layer 10$c$ can be lower. In addition, during the diffusion process, the thickness 10$ch$ of the diffusion layer 10$c$ can be controlled to not exceed 50 m or not exceed 30 m, such that the heavily doped region 11 can be easily diffused into the core layer 10$b$, and the surge capability of the power diode device 1 is improved.

Furthermore, the embodiment manufacturing method of the power diode device uses three photomasks. Compared with the power diode device manufacturing method that forms guard rings to relax the electric field distribution (usually requires at least 4 photomasks), the embodiment uses fewer photomasks, and thus the manufacturing process is simplified and the cost is lower.

In this disclosure, for description convenience, spatially relative terms such as “below”, “under”, “lower”, “above”, “upper”, “left side”, “right side”, and so on, may be used to describe the relationship of one component or feature with another one or more components or features, as shown in the accompanying drawings. The spatially relative terms are not only used to depict the orientations in the accompanying drawings, but also intended to encompass different orientations of the device in use or operation. A device may be oriented in other ways (rotated 90 degrees or at other orientations), and the spatially relative terms used herein may be interpreted in a corresponding way similarly. It should be understood that when a component is referred to as being “connected” or “coupled” to another component, it can be directly connected or coupled to another component or an intervening component may be present.

As used herein, the terms “approximately”, “basically”, “substantially” and “about” are used to describe and account for small variations. When used in conjunction with an event or instance, the terms may refer to an embodiment of exact occurrence of an event or instance as well as an embodiment where the event or instance is close to the occurrence. As used herein with respect to a given value or range, the term “about” generally means being within ±10%, ±5%, ±1%, or ±0.5% of the given value or range. A range herein may be referred to as being from one endpoint to the other or as being between two endpoints. All ranges disclosed herein are inclusive of endpoints unless otherwise indicated. The term “substantially coplanar” may mean that the difference of positions of two surfaces with reference to the same plane is within a few micrometers (m), e.g., within 10 m, within 5 m, within 1 m, or within 0.5 m. When values or characteristics are referred to as being “substantially” the same, the term may refer to a value that is within ±10%, ±5%, ±1%, or ±0.5% of the mean of the values.

The foregoing has outlined features of several embodiments and detailed aspects of present disclosure. The embodiments described in the present disclosure may be readily used as a basis for designing or modifying other processes and structures in order to carry out the same or similar purposes and/or to achieve the same or similar advantages of the embodiments presented herein. Such equivalent constructions do not depart from the spirit and scope of the present disclosure, and various changes, substitutions, and alterations can be made without departing from the spirit and scope of the present disclosure.

Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed:

1. A power diode device comprising a substrate, the substrate comprising:

a first diffusion layer of a first conductivity type, the first diffusion layer comprising a first surface and a second surface opposite to each other, and the first surface of the first diffusion layer forming a bottom surface of the substrate;

a second diffusion layer of a second conductivity type, the second diffusion layer comprising a first surface and a second surface opposite to each other, and the second surface of the second diffusion layer forming a top surface of the substrate;

a core layer of the first conductivity type between the first diffusion layer and the second diffusion layer, the core layer comprising a first surface and a second surface opposite to each other, the first surface of the core layer facing the first diffusion layer, the second surface of the core layer facing the second diffusion layer, and a thickness of the core layer being greater than a thickness of the second diffusion layer;

a heavily doped region of the second conductivity type in the second diffusion layer and extending toward the core layer, the heavily doped region comprising a first surface and a second surface opposite to each other, the second surface of the heavily doped region being coplanar with the second surface of the second diffusion surface, the first surface of the heavily doped region reaching the second surface of the core layer or reaching in-between the first surface of the core layer and the second surface of the core layer without reaching the first surface of the core layer, with a first PN junction formed between the heavily doped region and the core layer; and a first electrode layer, disposed on the top surface of the substrate without covering the second diffusion layer, the first electrode layer being in contact with the heavily doped region.

2. The power diode device of claim 1, wherein a second PN junction is formed between the core layer and the second diffusion layer, the first PN junction and the second PN junction forming a continuous junction.

3. The power diode device of claim 2, wherein the first PN junction protrudes over the second PN junction in a direction from the top surface of the substrate to the bottom surface of the substrate.

4. The power diode device of claim 1, wherein the substrate further comprises:

an isolation structure surrounding the heavily doped region, the isolation structure being separated from the heavily doped region by the second diffusion layer.

5. The power diode device of claim 4, wherein a depth of the isolation structure is greater than a depth of the heavily doped region.

6. The power diode device of claim 1, further comprising:

a second electrode layer, disposed on the bottom surface of the substrate and in contact with the first diffusion layer.

7. The power diode device of claim 1, further comprising:

a passivation layer, disposed on the top surface of the substrate and surrounding the first electrode layer, the passivation layer being in contact with the second diffusion layer and the heavily doped region, and an upper surface of the passivation layer being coplanar with an upper surface of the first electrode layer.

8. A power diode comprising:

a first diffusion layer of a first conductivity type in a substrate, the first diffusion layer comprising a first surface and a second surface opposite to each other, and the first surface of the first diffusion layer being a bottom surface of the substrate;

a second diffusion layer of a second conductivity type in the substrate, the second diffusion layer comprising a first surface and a second surface opposite to each other, and the second surface of the second diffusion layer being a top surface of the substrate;

a core layer of the first conductivity type between the first diffusion layer and the second diffusion layer, the core layer comprising a first surface and a second surface opposite to each other, the first surface of the core layer facing the first diffusion layer, and the second surface of the core layer facing the second diffusion layer;

a heavily doped region of the second conductivity type in the second diffusion layer, the heavily doped region extending into the core layer without reaching the first surface of the core layer, with a first PN junction formed between the heavily doped region and the core layer;

an isolation structure in the substrate and separated from the heavily doped region by the second diffusion layer; and a first electrode layer, disposed on the top surface of the substrate without covering the second diffusion layer, the first electrode layer being in contact with the heavily doped region.

9. The power diode of claim 8, wherein a second PN junction is formed between the second diffusion layer and the core layer, and a third PN junction is formed between the isolation structure and the second diffusion layer.

10. The power diode of claim 9, wherein the first PN junction and the second PN junction form a continuous junction.

11. The power diode of claim 8, wherein the isolation structure surrounds the heavily doped region and the second diffusion layer.

12. The power diode of claim 8, further comprising:

a second electrode layer, disposed on the bottom surface of the substrate and in contact with the first diffusion layer.

13. The power diode of claim 8, further comprising:

a passivation layer, disposed on the top surface of the substrate and in contact with the heavily doped region, the passivation layer surrounding the first electrode layer, the passivation layer being in contact with the second diffusion layer and the heavily doped region, and an upper surface of the passivation layer being coplanar with an upper surface of the first electrode layer.

14. A power diode device comprising:

a first diffusion layer of a first conductivity type;

a core layer of the first conductivity type on the first diffusion layer;

a second diffusion layer of a second conductivity type on the core layer, the second diffusion layer having a first surface facing away from the core layer, and first diffusion layer having a second surface facing away from the core layer;

a heavily doped region of the second conductivity type, extending from the first surface toward the core layer and through the second diffusion layer; and a first electrode layer, disposed on the heavily doped region without covering the second diffusion layer, the first electrode layer being in contact with a portion of the heavily doped region;

wherein a first PN junction formed between the heavily doped region and the core layer, and a second PN junction is formed between the core layer and the second diffusion layer.

15. The power diode device of claim 14, further comprising:

an isolation structure of the first conductivity type, extending from the first surface toward the core layer, and surrounding the second diffusion layer and the heavily doped region, the isolation structure being separated from the heavily doped region by the second diffusion layer, wherein a third PN junction is formed between the isolation structure and the second diffusion layer.

16. The power diode device of claim 14, further comprising:

a second electrode layer, disposed on the second surface and covering the first diffusion layer.

17. The power diode device of claim 14, further comprising:

a passivation layer, disposed on the first surface, and contacting partially the heavily doped region and contacting completely the first surface of the second diffusion layer, the passivation layer surrounding the first electrode layer, and an upper surface of the passivation layer being coplanar with an upper surface of the first electrode layer.

18. The power diode device of claim 17, wherein the passivation layer comprises an oxide layer, a nitride layer, an oxide layer and an insulating layer disposed with one on the other.

19. The power diode device of claim 7, wherein the passivation layer comprises an oxide layer, a nitride layer, an oxide layer and an insulating layer disposed with one on the other.

20. The power diode of claim 13, further comprising a third electrode layer disposed on the top surface of the substrate, an upper surface of the third electrode layer being coplanar with the upper surface of the passivation layer, and the third electrode layer only covering and contacting a portion of the isolation structure.

* * * * *